(12) United States Patent
Jensen et al.

(10) Patent No.: US 7,183,623 B2
(45) Date of Patent: Feb. 27, 2007

(54) TRIMMED INTEGRATED CIRCUITS WITH FUSE CIRCUITS

(75) Inventors: William D. Jensen, Farmington, MN (US); David W. Kelly, Lino Lakes, MN (US); Ronen Malka, Eden Prairie, MN (US)

(73) Assignee: Agere Systems Inc., Allentown, PA (US)

( * ) Notice: Subject to any disclaimer, the term of this patent is extended or adjusted under 35 U.S.C. 154(b) by 106 days.

(21) Appl. No.: 09/970,074

(22) Filed: Oct. 2, 2001

(65) Prior Publication Data

US 2003/0062591 A1    Apr. 3, 2003

(51) Int. Cl.
*H01L 29/00*    (2006.01)
*H01L 21/82*    (2006.01)
*H02H 5/04*    (2006.01)

(52) U.S. Cl. ............... 257/529; 361/104; 438/132
(58) Field of Classification Search ............... 438/110, 438/129, 132, 215, 281, 333, 458, 462, 467, 438/601; 257/208, 209, 528, 529
See application file for complete search history.

(56) References Cited

U.S. PATENT DOCUMENTS

| 3,974,443 | A | | 8/1976 | Thomas ................ 324/64 |
| 4,024,561 | A | | 5/1977 | Ghatalia |
| 4,319,396 | A | | 3/1982 | Law et al. ............. 29/571 |
| RE32,625 | E | | 3/1988 | Schwarz et al. ........ 374/57 |
| 4,801,869 | A | | 1/1989 | Sprogis ............... 324/73 |
| 4,918,377 | A | | 4/1990 | Buehler et al. ........ 324/691 |
| 4,935,645 | A | * | 6/1990 | Lee .................... 327/88 |
| 5,897,193 | A | * | 4/1999 | Nishino ................ 257/691 |
| 5,994,170 | A | * | 11/1999 | Pedersen et al. ........ 438/131 |
| 6,006,169 | A | | 12/1999 | Sandhu et al. .......... 702/132 |
| 6,028,756 | A | | 2/2000 | Freyman et al. ......... 361/104 |
| 6,108,804 | A | | 8/2000 | Derner ................. 714/721 |
| 6,121,677 | A | * | 9/2000 | Song et al. ............ 257/692 |
| 6,175,261 | B1 | | 1/2001 | Sundararaman et al. ... 327/525 |
| 6,211,745 | B1 | | 4/2001 | Mucke et al. .......... 331/117 R |
| 6,365,443 | B1 | * | 4/2002 | Hagiwara et al. ....... 438/130 |
| 6,548,826 | B2 | * | 4/2003 | Fenner et al. ......... 257/48 |
| 6,627,917 | B1 | * | 9/2003 | Fenner et al. ......... 257/48 |
| 6,806,494 | B2 | * | 10/2004 | Fenner et al. ......... 257/48 |

FOREIGN PATENT DOCUMENTS

| JP | 01093141 A | * | 4/1989 |
| JP | 10256324 A | * | 9/1998 |
| JP | 200124279 A | * | 4/2000 |

OTHER PUBLICATIONS

V. Ryan, Acceleration of Stress-Migration Failure in Aluminum Interconnect, Jun. 17, 1992, pp. 1-13.
V. Ryan, Enhanced Stress-Migration Reliability for ULSI Interconnect: An Insight into the Perils of Screening Al Depositions Based on Grain Size, 1995.
F.G. Yost, Stress-Voiding of Narrow Conductor Lines, 1990, pp. 40-44.

* cited by examiner

*Primary Examiner*—Alonzo Chambliss
(74) *Attorney, Agent, or Firm*—Kinney & Lange, PA

(57) ABSTRACT

A wafer containing integrated circuits having fuses which are selectively blown to trim circuit perimeters. The fuses are located adjacent scribe lanes, and fuse pads are located in the scribe lanes. The integrated circuits are trimmed by selectively energizing the fuse pads to blow selective fuses. When the integrated circuits are severed from the wafer, the fuse pads are severed from the integrated circuits.

14 Claims, 3 Drawing Sheets

TRIMMED INTEGRATED CIRCUITS WITH FUSE CIRCUITS

CROSS-REFERENCE TO RELATED APPLICATION(S)

None.

BACKGROUND OF THE INVENTION

The invention relates to the trimming of integrated circuits. In particular, the invention relates to the trimming of integrated circuits using fuse circuitry, while minimizing the amount of die area consumed by the fuse circuitry.

During the manufacturing of integrated circuits, process variations can result in variations in electrical characteristics of the circuitry. A technique known as trimming is typically used to compensate for process variations. After the circuit manufacturing, various components of the integrated circuit are adjusted, or trimmed, to bring the electrical characteristics within permitted parameters. For example, trimming can be used to adjust resistances or capacitances, to adjust transconductance values, and to correct for DC offsets produced by process variations.

One trimming technique makes use of fuse circuitry, which is incorporated into the integrated circuit. Based upon a functional measurement of the integrated circuit performed by probing the wafer during an initial wafer test, the need for trimming is identified. Selected fuses are then blown to make the necessary adjustments to the integrated circuit.

Fuse circuits used for device trimming require fuse probe pads and wide metal lines to accommodate the large currents which are necessary for fuse blowing. The large physical size of these fuse components, compared to their simple function, contributes disproportionally to the die size. This is undesirable because the fuse components take up a significant amount of die area that could otherwise be allocated to other useful circuits, or allow a smaller die to be used.

In an attempt to counteract this disproportionate use of die area by fuse circuitry, design rules have attempted to compact the fuse circuitry, and the number of fuses used in an integrated circuit is typically limited. However, fuse component sizes and the associated design rules still dictate large die area usage, and minimizing the number of trim fuses hampers a designer's ability to assign the optimum number of trim circuits.

BRIEF SUMMARY OF THE INVENTION

An integrated circuit wafer with significant savings in integrated circuit die area is achieved by positioning fuse circuits (fuses and associated circuitry) adjacent to the scribe lane between integrated circuits, and locating the fuse pads and power supply pads within the scribe lane. Conductors extend from the fuse circuits within the integrated circuit into the scribe lane to connect the pads to the fuse circuit. When the integrated circuits are severed from the wafer, the pads located within the scribe lane are severed from the integrated circuits.

DETAILED DESCRIPTION

Figure 1:
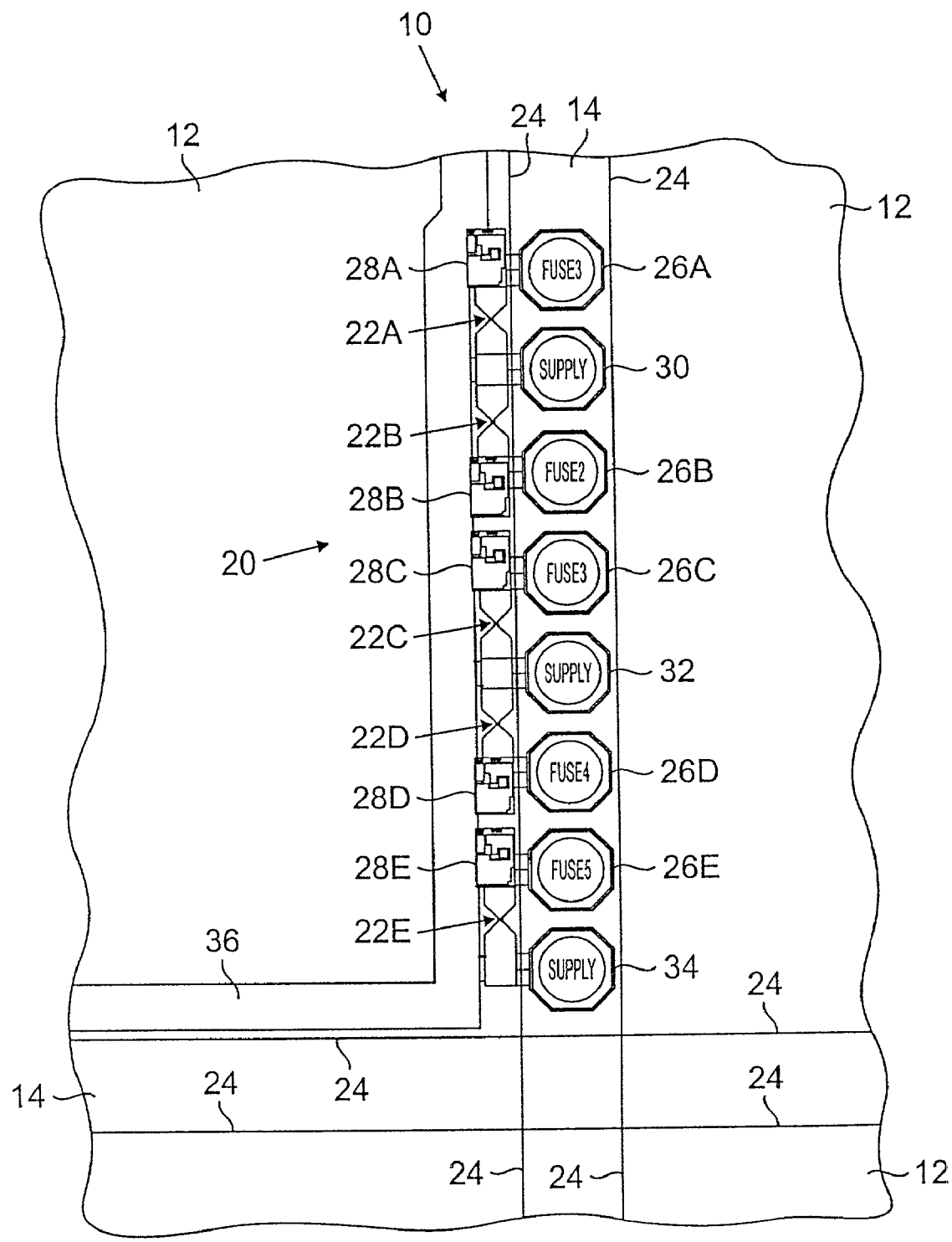
FIG. 1 shows an on-die fuse cell of the present invention with fuse pads located in adjacent scribe lane.

FIG. 1 shows a portion of integrated circuit wafer 10, on which integrated circuits are formed. Scribe lanes 14 separate integrated circuits 12 from one another, and provide an area in which scribing occurs to separate the individual integrated circuit die 12 from wafer 10.

FIG. 1 illustrates on-die fuse cell 20 which is configured in accordance with the present invention. Fuse cell 20 includes five fuses 22A, 22B, 22C, 22D, and 22E which are oriented along die edge 24.

Connected to one end of each fuse 22A–22E are fuse pads 26A–26E and fuse circuitry 28A–28E, respectively. A power supply pad is connected to an opposite side of each fuse. Power supply pad 30 is connected to fuses 28A and 28B. Power supply pad 32 is connected to fuses 22C and 22D. Supply pad 34 is connected to fuse 22E.

Fuses 22A–22E are oriented parallel to die edge 24 and are immediately adjacent to scribe lane 14. Fuse circuitry 28A–28E is also positioned as close as possible to die edge 24. The location and orientation of fuses 22A–22E and fuse circuitry 28A–28E minimizes their intrusion into die 12. This minimizes their area usage and avoids interference with other on-chip circuitry as much as possible.

Further on-die space is saved by positioning fuse pads 26A–26E and power supply pads 30, 32, and 34 in scribe lane 14. These pads are used only during the fuse blowing process, which occurs after wafer test and before the individual integrated circuit die 12 is severed from wafer 10. Once the fuse is blown, pads 26A–26E, 30, 32, and 34 are no longer needed. They become sacrificial, since they are located in the scribe lane. Having performed their task prior to wafer dicing, they are no longer needed and are removed when the scribe lanes are cut.

Also shown in FIG. 1 is supply bus 36. The remaining circuitry on integrated circuit die 12 is not shown. Also, the connection of fuse circuitry 28A–28E to the remaining circuitry of integrated circuit 12 is not shown.

During the wafer test, each integrated circuit is individually tested. Based upon those tests, selected fuses are blown by applying electrical current through the appropriate fuse and supply pads. For example, if fuse 22B were to be blown, current would be supplied through probes and connect with supply pad 30 and fuse pad 26B to cause fuse 22B to be blown.

During normal operation of the integrated circuit, fuse circuitry 28A–28E detect the fuse states (connected or blown) of their associated fuses 22A–22E respectively, and provide appropriate signals to the circuitry of integrated circuit 12 based upon those fuse states.

Figure 2:
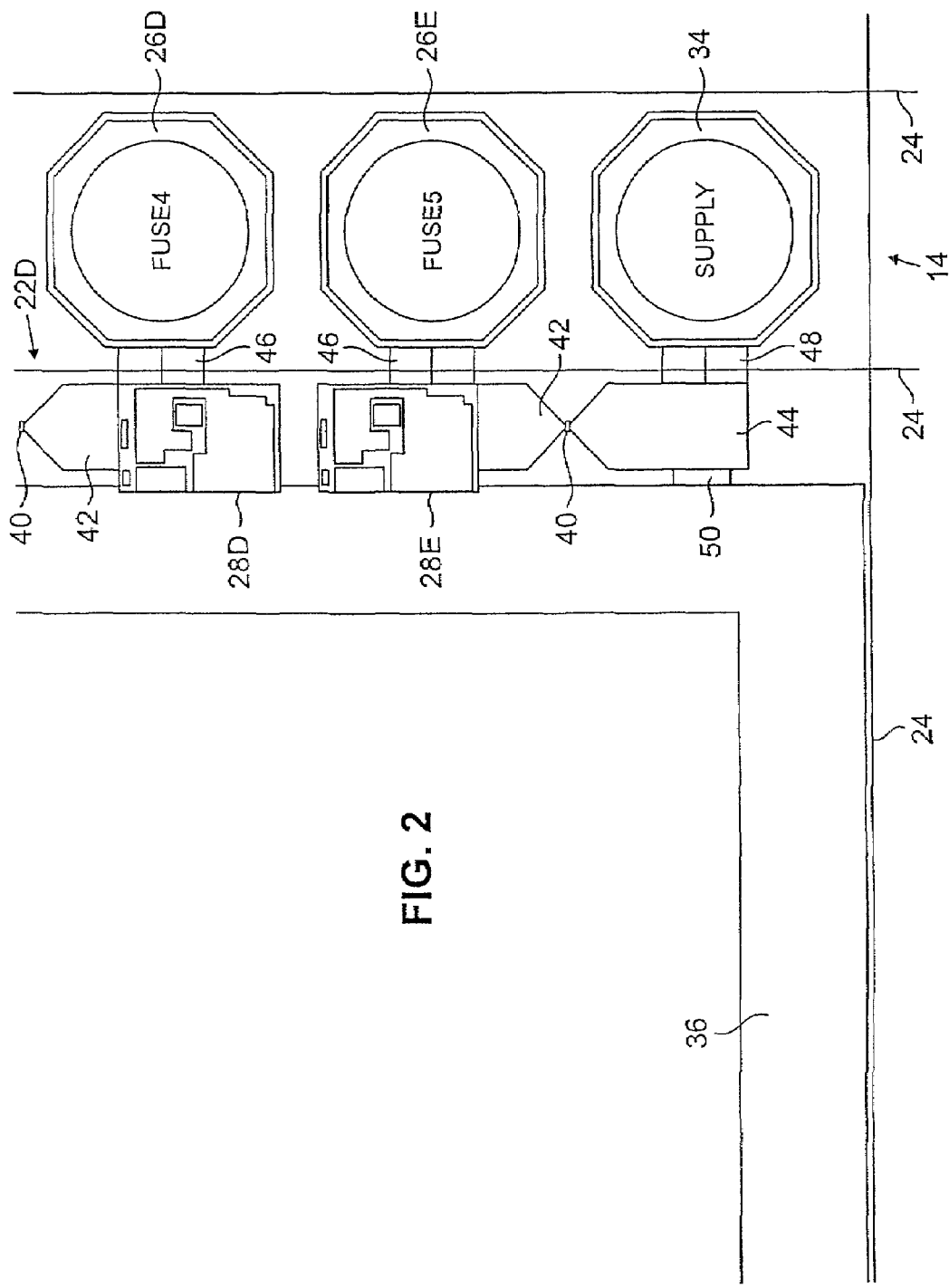
FIG. 2 is an enlarged view of a portion of the fuse cell of FIG. 1.

FIG. 2 is an enlarged view of a portion of FIG. 1. In particular, fuse 22E is shown in more detail. Fuse 22E is typical of each of the fuses 22A–22E shown in FIG. 1.

As seen in FIG. 2, fuse 22E includes fuse element 40 which is positioned between conductors 42 and 44. Conductor 42 is connected to fuse circuitry 28E. In addition, conductor 42 is connected to fuse pad 26E by conductor 46.

Conductor 44 is connected by conductor 48 to supply pad 34 and by conductor 50 to supply bus 36. Supply bus 36 provides the supply signal to the fuses after the supply pads adjacent to the fuses have been cut away (see FIG. 3). Conductors 46 and 48 extend from scribe lane 14 across die edge 24 to conductors 42 and 44, respectively. After wafer dicing, conductors 46 and 48 are severed so that only a remnant stub remains. This is seen along the right edge of FIG. 3.

Figure 3:
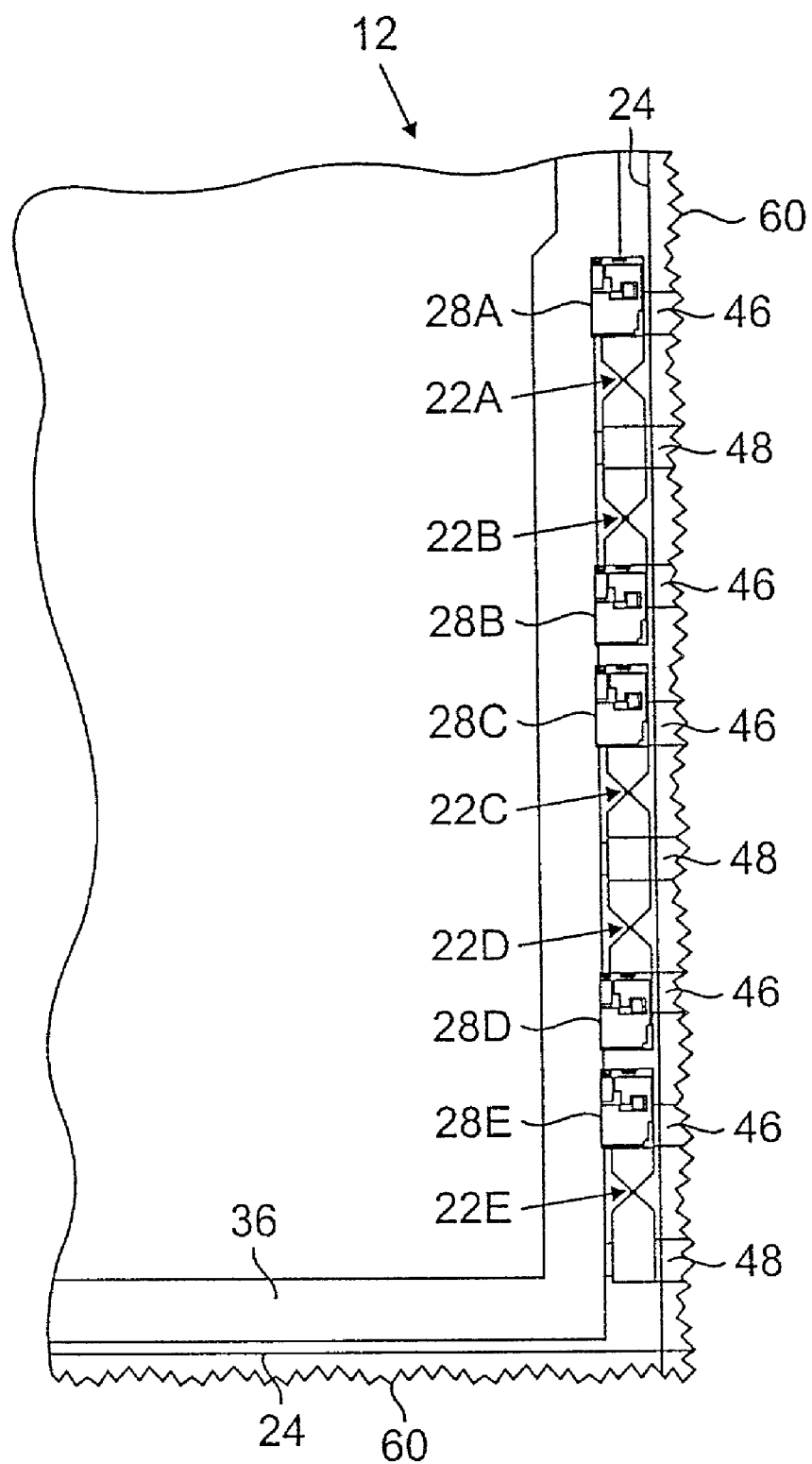
FIG. 3 shows the fuse cell of FIG. 1 after the die has been severed from the wafer.

FIG. 3 shows wafer 12 and fuse cell 20 after integrated circuit die 10 has been severed from wafer 10. Pads 26–26E, 30, 32, and 34 have be removed as part of the severing process, and do not occupy die area. Severed edges 60 are created by the severing process, and are close to die edges 24.

Another important advantage of the fuse cell of the present invention is the use of fuse and supply pads which are contacted only by probes during the fuse blowing process. None of the pads later function as bond pads, as has been the case in prior art on-die fuse cells. Since none of the fuse pads are bonded, an associated electrostatic discharge (ESD) protection device is not required in association with each fuse. This also results in a significant saving in the die area occupied by the fuse cell.

By minimizing the area occupied on the integrated circuit die by the fuses and their associated pads and circuitry, significantly less die area is consumed by the on-die fuse cell. As a result, a larger percentage of the die is available for other on-chip circuitry. Also, because the on-chip impact of each fuse is significantly reduced, additional fuses desired by designer can be accommodated with minimal impact to die size.

Although the present invention has been described with reference to preferred embodiments, workers skilled in the art will recognize that changes may be made in form and detail without departing from the spirit and scope of the invention. For example, this invention is not limited to a fuse connection to a supply pad. Fuses can be connected to a positive supply, a negative supply, ground, or any other signal. It is not necessary that a common signal be used for all of the fuses on an integrated circuit. Each fuse could be connected to a dedicated pair of pads that connect to nothing other than the fuse and the associated fuse sensing circuitry.

The invention claimed is:

1. An integrated circuit wafer comprising:
    an integrated circuit die having a device trimming fuse circuit;
    a first pad positioned in a scribe lane adjacent the integrated circuit die;
    a second pad positioned in the scribe lane adjacent the integrated circuit die;
    a first conductor extending from the device trimming fuse circuit to the first pad and
    a second conductor extending from the device trimming fuse circuit to the second pad, wherein the first and second conductors form a current path that provides a fuse blowing signal selectively applied between the first pad and the second pad to the device trimming fuse circuit to electrically trim the integrated circuit die.

2. The integrated circuit wafer of claim 1 wherein the first and second pads are a fuse pad and a supply pad, respectively.

3. The integrated circuit wafer of claim 1 wherein the device trimming fuse circuit includes a fuse and circuitry for sensing whether the fuse is blown.

4. The integrated circuit of claim 3 wherein the fuse and the circuitry are aligned generally parallel to an edge of an integrated circuit die.

5. The integrated circuit of claim 4 wherein the first and second conductors are oriented generally perpendicular to the edge.

6. An integrated circuit wafer comprising:
    a plurality of integrated circuit dice separated from one another by scribe lanes, the dice having device trimming fuse circuits adjacent the scribe lanes; and
    a plurality of pads positioned in the scribe lane, wherein each device trimming fuse circuit is connected to two of the plurality of pads positioned in the scribe lane by conductors that create a current path that allows a fuse blowing signal to be applied to the device trimming fuse circuits to electrically trim the integrated circuit die, so that following singularization of the dice from the wafer, the pads are disconnected from the device trimming fuse circuits.

7. The integrated circuit wafer of claim 6 wherein each device trimming fuse circuit is connected to a fuse pad.

8. The integrated circuit wafer of claim 7 wherein each device trimming fuse circuit includes a fuse connected between the fuse pad and the power supply pad by the conductors which cross the die edges.

9. The integrated circuit wafer of claim 8 wherein each device trimming fuse circuit includes circuitry for sensing whether the fuse is blown.

10. The integrated circuit wafer of claim 6 wherein the device trimming fuse circuits are aligned in rows generally parallel to the scribe lanes.

11. A trimmable integrated circuit comprising:
    a plurality of device trimming fuses positioned adjacent a die edge of the integrated circuit;
    a plurality of pads positioned in a scribe lane adjacent to the die edge; and
    a plurality of conductors extending across the die edge for connecting at least two of the plurality of pads to each of the plurality of device trimming fuses to allow electrical trimming of the integrated circuit by selective blowing of the device trimming fuses, the conductors being severable during singularization of the integrated circuit.

12. The trimmable integrated circuit of claim 11 wherein the device trimming fuses are aligned in a row generally parallel to the die edge.

13. The trimmable integrated circuit of claim 11 wherein a pair of adjacent device trimming fuses share one common pad.

14. An integrated circuit die having a plurality of device trimming fuse circuits adjacent a die edge and conductors extending from the device trimming fuse circuits to the die edge, the conductors providing connection between the device trimming fuse circuits and a plurality of pads located in a scribe lane, the plurality of pads being severed from the die subsequent to selective blowing of fuses of the device trimming fuse circuits by applying a signal to a current path that includes two of the plurality of pads and a selected device trimming fuse circuit.

* * * * *